(12) United States Patent
Lee

(10) Patent No.: US 10,014,058 B2
(45) Date of Patent: Jul. 3, 2018

(54) SEMICONDUCTOR DEVICE AND METHOD OF MANUFACTURING THE SAME

(71) Applicant: SK hynix Inc., Icheon-si, Gyeonggi-do (KR)

(72) Inventor: Nam Jae Lee, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/334,042

(22) Filed: Oct. 25, 2016

(65) Prior Publication Data

US 2017/0358362 A1    Dec. 14, 2017

(30) Foreign Application Priority Data

Jun. 9, 2016  (KR) ................. 10-2016-0071731

(51) Int. Cl.
| | |
|---|---|
| *H01L 21/00* | (2006.01) |
| *G11C 16/16* | (2006.01) |
| *G11C 16/04* | (2006.01) |
| *G11C 16/26* | (2006.01) |
| *G11C 16/30* | (2006.01) |
| *H01L 23/522* | (2006.01) |
| *H01L 23/528* | (2006.01) |
| *H01L 23/00* | (2006.01) |
| *H01L 27/11524* | (2017.01) |
| *H01L 27/11529* | (2017.01) |
| *H01L 27/11556* | (2017.01) |
| *H01L 27/1157* | (2017.01) |

(Continued)

(52) U.S. Cl.
CPC .......... *G11C 16/16* (2013.01); *G11C 16/0466* (2013.01); *G11C 16/0483* (2013.01); *G11C 16/26* (2013.01); *G11C 16/30* (2013.01); *H01L 23/528* (2013.01); *H01L 23/5226* (2013.01); *H01L 23/562* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 27/11582* (2013.01); *H01L 29/1087* (2013.01)

(58) Field of Classification Search
CPC . G11C 16/16; G11C 16/0466; G11C 16/0483; G11C 16/26; G11C 16/30; H01L 23/5226; H01L 23/528; H01L 23/562; H01L 27/11524; H01L 27/11529; H01L 27/11556; H01L 27/1157
See application file for complete search history.

(56) References Cited

U.S. PATENT DOCUMENTS

2016/0315045 A1* 10/2016 Baek ................ H01L 23/5283
2016/0322382 A1* 11/2016 Lee .................. H01L 27/11582

FOREIGN PATENT DOCUMENTS

KR    10-2015-0129940 A    11/2015

* cited by examiner

*Primary Examiner* — Richard Booth
(74) *Attorney, Agent, or Firm* — William Park & Associates Ltd.

(57) ABSTRACT

A semiconductor device may include an insulating layer, a bulk pattern, a stack structure, and a channel pattern. A first trench may be formed in the insulating layer. A bulk pattern may be located in the first trench and includes a metal pattern and an electron hole source. The stack structure may be located on the insulating layer and includes conductive layers and insulating layers, which are alternately stacked. The channel pattern may penetrate the stack structure, and may be supplied with electron holes from the bulk pattern.

20 Claims, 12 Drawing Sheets

(51) Int. Cl.
*H01L 27/11573* (2017.01)
*H01L 27/11582* (2017.01)
*H01L 29/10* (2006.01)

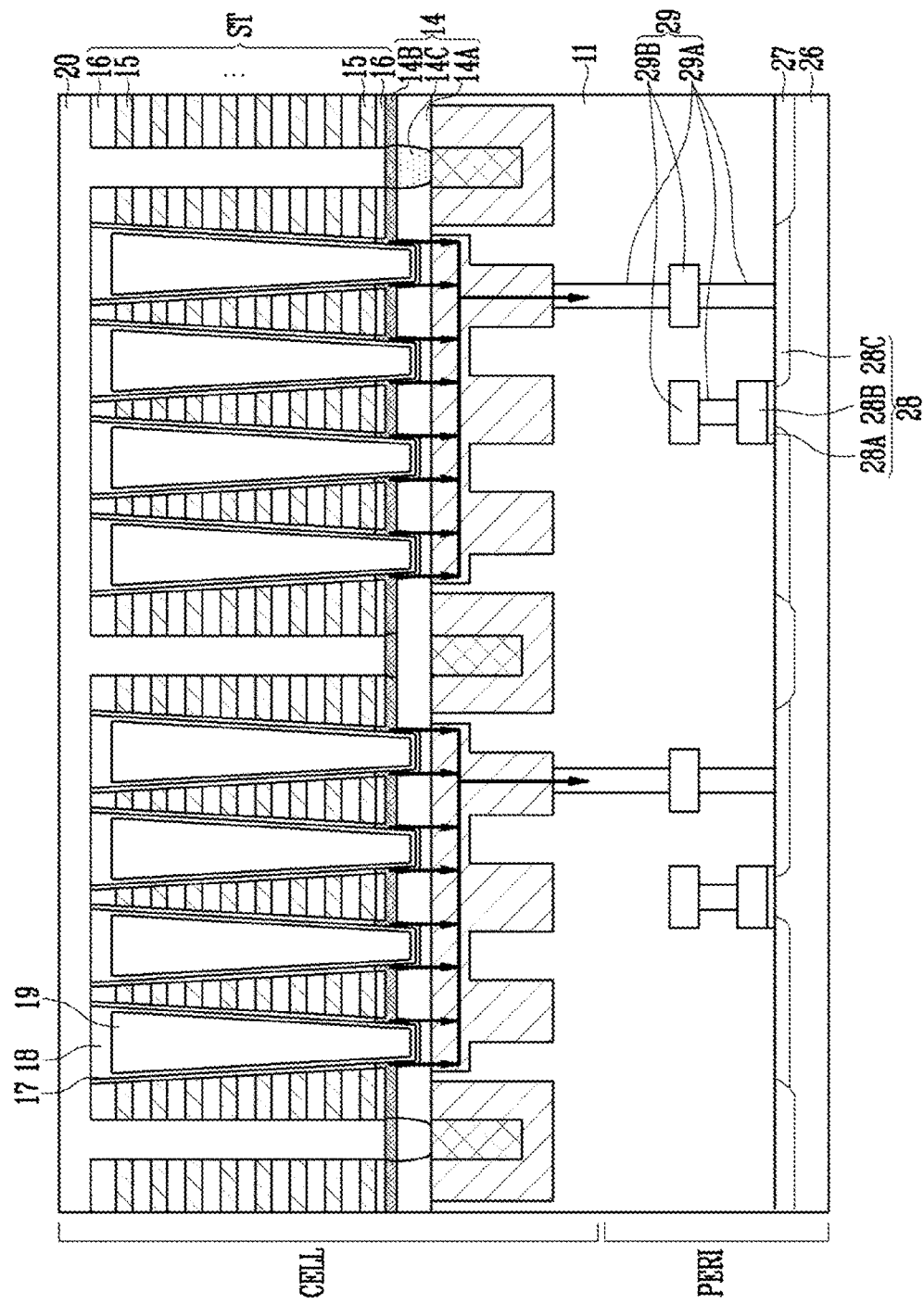

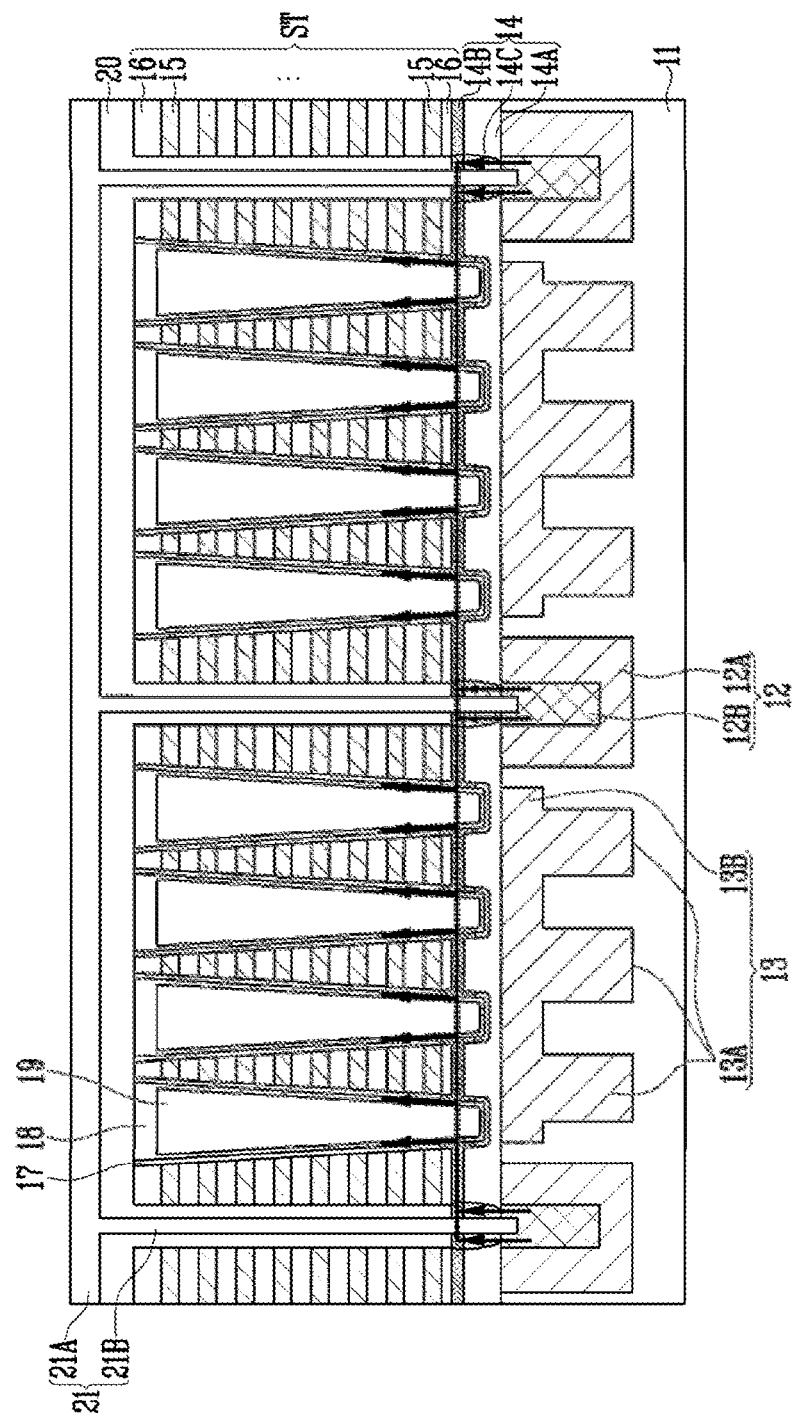

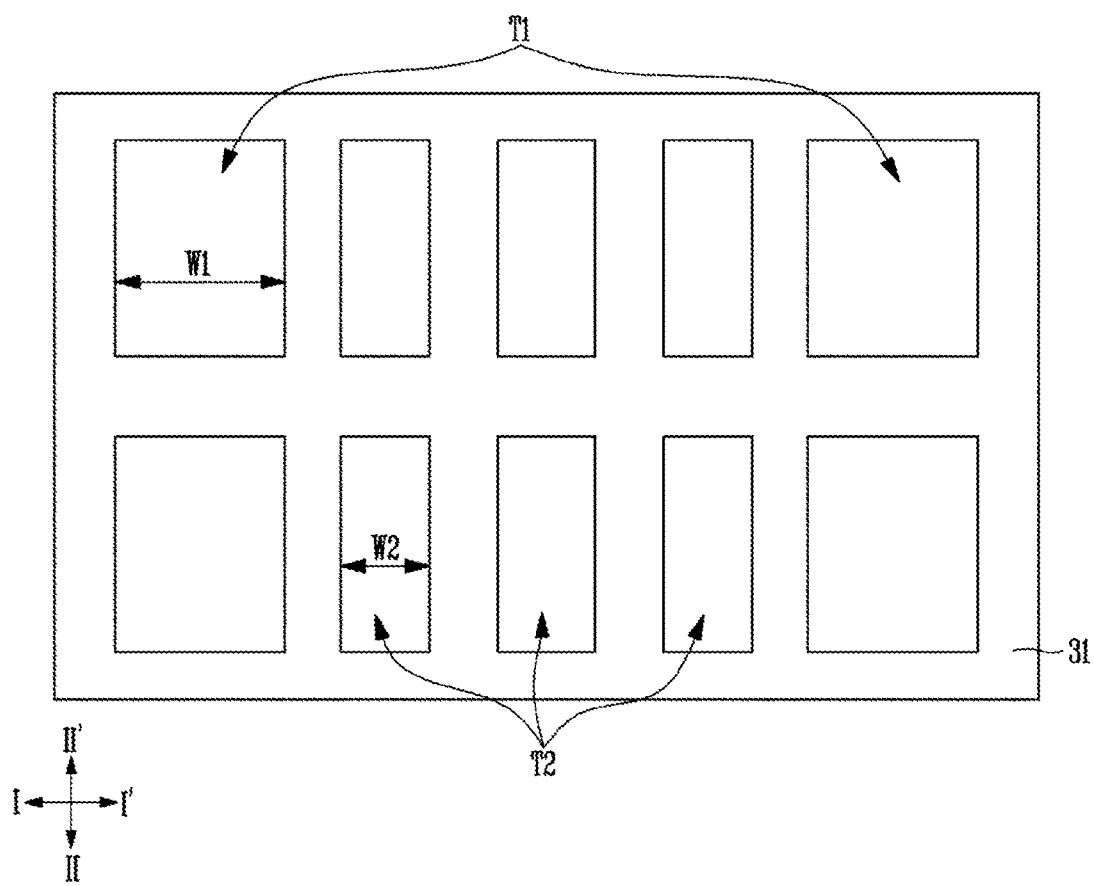
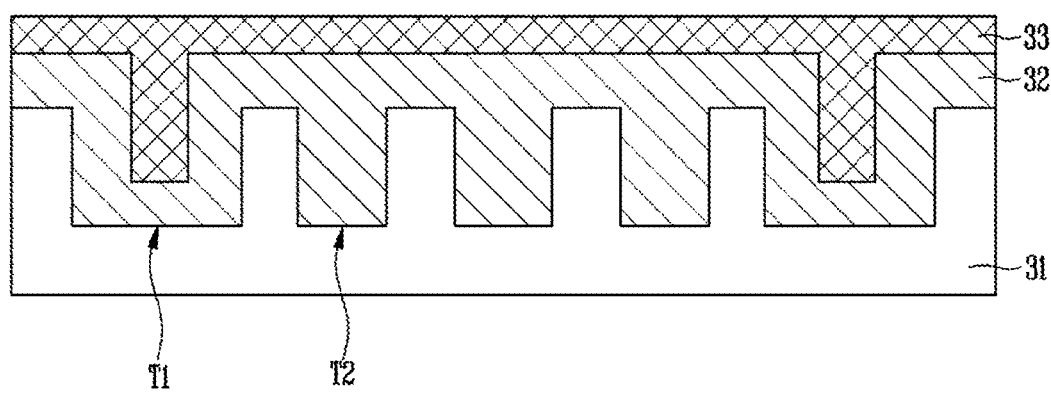

SEMICONDUCTOR DEVICE AND METHOD OF MANUFACTURING THE SAME

CROSS-REFERENCE TO RELATED APPLICATION

The present application claims priority under 35 U.S.C. § 119(a) to Korean patent application number 10-2016-0071731 filed on Jun. 9, 2016 in the Korean Intellectual Property Office, the entire disclosure of which is incorporated herein by reference.

BACKGROUND

1. Technical Field

An aspect of the present disclosure generally relates to an electronic device and a method of manufacturing the same, and more particularly to a three-dimensional semiconductor device and a method of manufacturing the same.

2. Related Art

Nonvolatile memory devices are memory devices that retain their data even when a power supply is cut off. As a two-dimensional nonvolatile memory technology is reaching its physical scaling limit, some semiconductor manufacturers are producing three-dimensional nonvolatile memory devices in which memory cells are vertically stacked on top of each other on a substrate.

The three-dimensional nonvolatile memory device may include interlayer insulating layers and gate electrodes, which are alternately stacked, and channel layers penetrating the interlayer insulating layers and the gate electrodes. The memory cells are arranged along the channel layers. Various structures and manufacturing methods have been developed to improve the reliability of the three-dimensional nonvolatile memory devices.

SUMMARY

According to an aspect of the present disclosure, a semiconductor device may include an insulating layer, a bulk pattern, a stack structure, and a channel pattern. A first trench may be formed in the insulating layer. The bulk pattern may be located in the first trench, and may include a metal pattern and an electron hole source. The stack structure may be located on the insulating layer, and may include conductive layers and insulating layers, which are alternately stacked. The channel pattern may penetrate the stack structure, and may be supplied with electron holes from the bulk pattern.

According to an aspect of the present disclosure, a semiconductor device may include a bulk pattern, a source pattern, a stack structure, a channel pattern, and a connecting layer. The bulk pattern may be located in an insulating layer, and may include an electron hole source. The source pattern may be located in the insulating layer. The stack structure may be located on the insulating layer, and may include conductive layers and insulating layers, which are alternately stacked. The channel pattern may penetrate the stack structure. The connecting layer may be interposed between the insulating layer and the stack structure, and may connect the bulk pattern, the source pattern, and the channel pattern to each other.

According to an aspect of the present disclosure, a method of manufacturing a semiconductor device may include forming a first trench in an insulating layer. The method may include forming, in the first trench, a bulk pattern including an electron hole source. The method may include forming, on the insulating layer, a stack structure in which first material layers and second material layers are alternately stacked. The method may include forming a channel pattern penetrating the stack structure, the channel pattern being connected to the bulk pattern. The method may also include forming a connecting layer interposed between the stack structure and the insulating layer, the connecting layer connecting the bulk pattern and the channel pattern to each other.

According to an aspect of the present disclosure, a method of manufacturing a semiconductor device may include forming a bulk pattern and a source pattern in an insulating layer. The method may include forming a sacrificial layer on the insulating layer. The method may include forming, on the sacrificial layer, a stack structure in which first material layers and second material layers are alternately stacked. The method may include forming a channel pattern penetrating the stack structure and the sacrificial layer; removing the sacrificial layer, thereby forming an opening. The method may include forming, in the opening, a connecting layer connecting the bulk pattern, the source pattern, and the channel pattern to each other.

BRIEF DESCRIPTION OF THE DRAWINGS

FIGS. 2A and 2B are cross-sectional views illustrating an example structure of the semiconductor device according to the embodiment of the present disclosure.

FIGS. 3A, 3B, 4A, 4B, and 5 to 10 are layouts and cross-sectional views illustrating an example method of manufacturing a semiconductor device according to an embodiment of the present disclosure.

DETAILED DESCRIPTION

Figure 1:
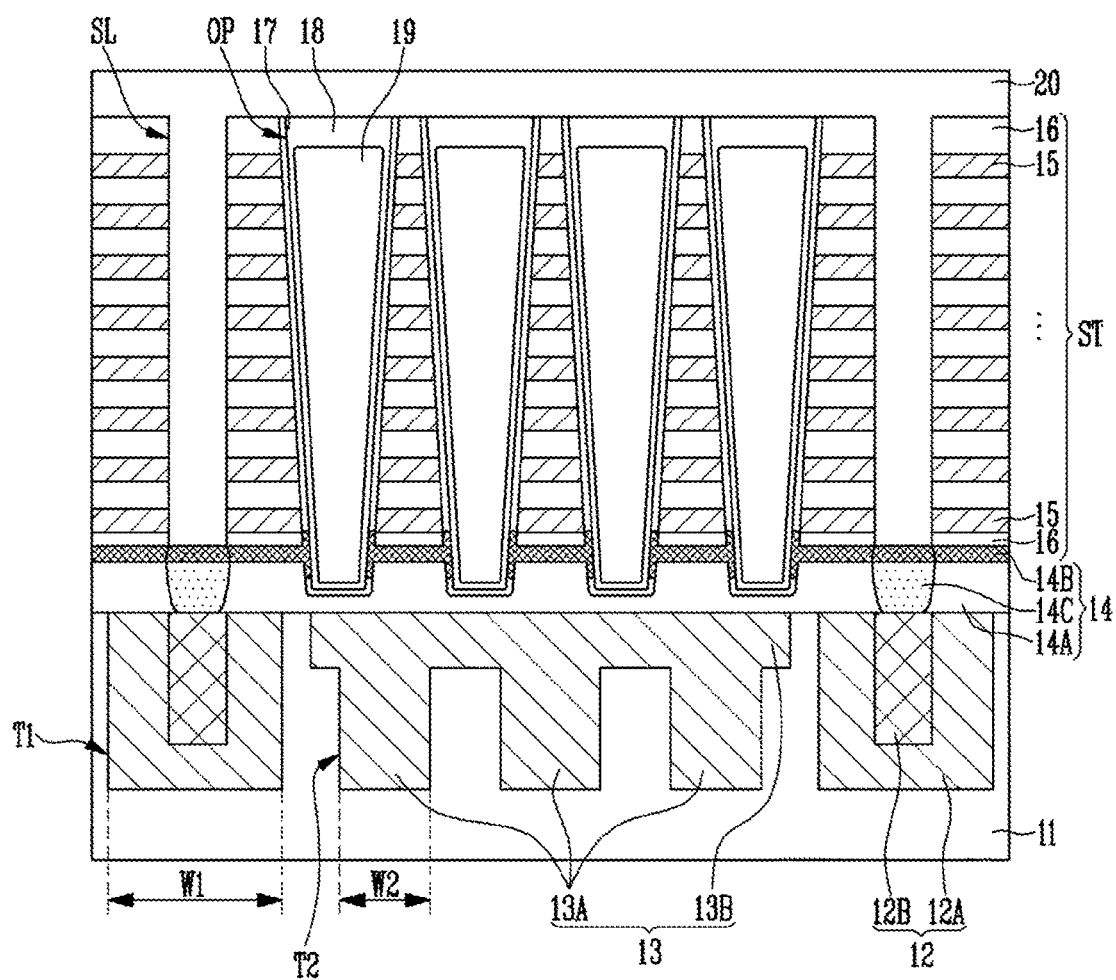
FIG. 1 is a cross-sectional view illustrating an example structure of a semiconductor device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Example embodiments of the present disclosure will be described with reference to the accompanying drawings. The example embodiments of the present disclosure may, however, be embodied in many different forms and should not be construed as limited to the example embodiments set forth herein. Rather, the example embodiments are provided so that disclosure of the present disclosure will be thorough and complete, and will fully convey the scope of the present disclosure to those skilled in the art. The features of example embodiments of the present disclosure may be employed in various and numerous embodiments without departing from the scope of the present disclosure. In the drawings, the size and relative sizes of layers and areas may be exaggerated for clarity. The drawings are not to scale. Like reference numerals refer to like elements throughout.

FIG. 1 is a cross-sectional view illustrating an example structure of a semiconductor device according to an embodiment of the present disclosure.

Referring to FIG. 1, the semiconductor device according to an embodiment of the present disclosure may include an insulating layer 11, a bulk pattern 12 and a source pattern 13 in the insulating layer 11, and may also include a stack structure ST and a channel pattern 18 penetrating the stack structure ST.

The insulating layer 11 may include at least one first trench T1 and at least one second trench T2. For example, a plurality of trenches T2 may be located between adjacent first trenches T1, and the first trenches T1 and the second trenches T2 may be arranged at an equal distance. Also, the first trench T1 may have a wider width (W1>W2) than the second trench T2, and the first trench T1 and the second trench T2 may be located at substantially the same level (e.g., the same height from a substrate). Here, the term "substantially the same" means not only that the first trench T1 and the second trench T2 are located at the same level as each other, but also that, between the levels of the first trench T1 and the second trench T2, there may be some discrepancies that occur as a result of possible errors in the process.

The bulk pattern 12 may supply electron holes into the channel pattern 18 in an erase operation, and may be located in the first trench T1. For example, the bulk pattern 12 may include a metal pattern 12A in the first trench T1 and an electron hole source 12B in the metal pattern 12A. The metal pattern 12A may include tungsten W, titanium Ti, tantalum Ta, etc. The electron hole source 12B may be a polysilicon pattern including a P-type impurity.

The source pattern 13 may be located in the second trench T2, and may include a metal such as tungsten W, titanium Ti, or tantalum Ta. For example, the source pattern 13 may be formed of the same material as the metal pattern 12A of the bulk pattern 12. For example, the source pattern 13 may include a plurality of protruding parts 13A and a body part 13B connecting the plurality of protruding parts 13A to each other. The protruding parts 13A may protrude from a bottom surface of the body part 13B. Also, the source pattern 13 and the bulk pattern 12 may be located at substantially the same level.

The stack structure ST may be located over the insulating layer 11, and may include conductive layers 15 and the insulating layers 16, which are alternately stacked. Here, the conductive layers 15 may be gate electrodes of transistors such as a select transistor and memory cells, and the insulating layers 16 may insulate the stacked gate electrodes from each other. For example, at least one uppermost conductive layer 15 may be a gate electrode of an upper select transistor, at least one lowermost conductive layer 15 may be a gate electrode of a lower select transistor, and the other conductive layers 15 may be gate electrodes of memory cells. In addition, a memory cell string may include at least one lower select transistor, a plurality of memory cells, and at least one upper select transistor, which are connected in series. The memory cell string may be vertically disposed.

Also, the stack structure ST may include at least one slit SL and at least one opening OP. The slit SL penetrates the stack structure ST in a direction in which constituent layers of the stack structure ST are staked, thereby exposing a connecting layer 14 therethrough, and may have a line shape extending in one direction. An insulating layer 20 may fill the slit SL. Also, the opening OP may penetrate the stack structure ST in the direction in which the constituent layers of the stack structure ST are staked, thereby exposing the connecting layer 14 therethrough, and may have a circular section, an elliptical section, a quadrangular section, a polygonal section, or the like. The channel pattern 18 may be formed in the opening OP.

The channel pattern 18 may be connected to the connecting layer 14 by penetrating the stack structure ST, and may be connected to the bulk pattern 12 or the source pattern 13 through the connecting layer 14. The channel pattern 18 may be formed in a way that fills a central region of the opening OP penetrating the stack structure ST. Alternatively, the channel pattern 18 may be formed in a way that leaves the central region of the opening OP empty. In this case, a gap fill layer 19 may fill the empty space (e.g., central region) of the channel pattern 18.

A memory pattern 17 may surround a sidewall of the channel pattern 18, and may include at least one of a tunnel insulating layer, a data storage layer, and a charge blocking layer. For example, the data storage layer may include a floating gate material such as silicon, a charge trap material such as nitride, a phase change material, nano-dots, etc.

The connecting layer 14 may be interposed between the insulating layer 11 and the stack structure ST, and may connect the bulk pattern 12, the source pattern 13, and the channel pattern 18 to each other. The connecting layer 14 may include a first connecting layer 14A, which contacts the bulk pattern 12 and the source pattern 13, and a second connecting layer 14B, which contacts the channel pattern 18 by penetrating the memory pattern 17. Here, the first connecting layer 14A may be a polysilicon layer including an N-type impurity. The second connecting layer 14B may be a polysilicon layer selectively grown from the channel pattern 18 and the first connecting layer 14A, or may be a polyslicon layer selectively deposited on the channel pattern 18 and the first connecting layer 14A.

Also, the connecting layer 14 may include an impurity region 14C. The impurity region 14C may be located under the slit SL, and may contact the bulk pattern 12. For example, the impurity region 14C may contact the electron hole source 12B of the bulk pattern 12. The impurity region 14C may have the same type as the electron hole source 12B. For example, when the electron hole source 12B includes a P-type impurity, the impurity region 14C may also include a P-type impurity.

FIGS. 2A and 2B are cross-sectional views illustrating a structure of the semiconductor device according to an embodiment of the present disclosure.

Referring to FIG. 2A, the semiconductor device according to an embodiment of the present disclosure may include a cell region CELL and a peripheral region PERI located under the cell region CELL. The stack structure ST described with reference to FIG. 1 may be located in the cell region CELL. Memory cell strings including memory cells stacked in multiple layers are arranged in the cell region CELL. A circuit for driving the memory cell strings may be located in the peripheral region PERI.

The circuit may include a transistor 28, a resistor, capacitor, and the like, which are located on a substrate 26, and the circuit and the memory cell strings are electrically connected to each other by an interconnect 29. For example, the transistor 28 may include a gate electrode 28B on the substrate 26, a gate insulating layer 28A interposed between the substrate 26 and the gate electrode 28B, and a junction 28C in the substrate 26. An active region may be defined by a device isolation layer 27 in the substrate 26. The interconnect 29 may include contact plugs 29A and lines 29B, which are connected to the gate electrode 28B or the junction 28C of the transistor 28.

The transistor 28 may be controlled to supply a bias voltage to the source pattern 13 or supply a ground voltage the source pattern 13 during a read operation or program operation. For example, the junction 28C of the transistor 28 and the source pattern 13 may be electrically connected to each other by the interconnect 29, and the source pattern 13 may be pulled to ground by turning on the transistor 28 in the read operation.

Referring to FIG. 2B, the semiconductor device according to an embodiment of the present disclosure may include an interconnect 21 electrically connected to the bulk pattern 12. The interconnect 21 may include a line 21A located over the stack structure ST and a vertical structure 21B electrically connecting the line 21A and the bulk pattern 12 to each other. Here, the vertical structure 21B may have various shapes such as a plug shape and a line shape. The vertical structure 21B may be located in the slit SL to electrically connect the bulk pattern 12 and the line 21A to each other. Thus, in the erase operation, if an erase bias is applied to the bulk pattern 12 through the interconnect 21, electron holes may be generated from the electron hole source 12B and move to the channel pattern 18 through the connecting layer 14.

FIGS. 3A, 3B, 4A, 4B, and 5 to 10 are layouts and cross-sectional views illustrating a method of manufacturing a semiconductor device according to an embodiment of the present disclosure.

Referring to FIGS. 3A and 3B, first trenches T1 and second trenches T2 are formed in an insulating layer 31. For example, a mask pattern may be formed on the insulating layer 31, and then the insulating layer 31 may be etched using the mask pattern as an etch barrier, thereby forming the first and second trenches T1 and T2. Accordingly, the first and second trenches T1 and T2 may be simultaneously formed.

The first trench T1 may be used to form a bulk pattern, and the second trench T2 may be used to form a source pattern. The first and second trenches T1 and T2 may be arranged in a first direction I-I' and a second direction II-II' intersecting the first direction I-I'. Also, a plurality of second trenches T2 may be located between adjacent first trenches T1.

The first trench T1 and the second trench T2 may have different width from each other, and the second trench T2 may have a narrower width than the first trench T1. Also, the first trench T1 and the second trench T2 may be located at substantially the same level.

Subsequently, a metal layer 32 may be formed on the insulating layer 31 including the first and second trenches T1 and T2. Here, the metal layer 32 may be formed along inner surfaces of the first and second trenches T1 and T2. The metal layer 32 may have a thickness enough to partially fill the first trench T1 and completely fill the second trench T2. For example, the metal layer 32 may include tungsten W, titanium Ti, tantalum Ta, silicide, etc. The metal layer 32 may also formed on an upper surface of the insulating layer 31 between adjacent first and second trenches T1 and T2.

In this way, when a region in which a bulk pattern BP and a source pattern SP are to be formed is defined by forming trenches in the insulating layer 31, a deposition thickness of the metal layer 32 can be minimized. Thus, it is possible to prevent possible stress on boundaries between layers.

Subsequently, an electron hole source layer 33 is formed on the metal layer 32. Here, the electron hole source layer 33 may have a thickness enough to completely fill the first trench T1. For example, the electron hole source layer 33 may include a material capable of generating electron holes, and may be a polysilicon layer including a P-type impurity.

Figure 4A:
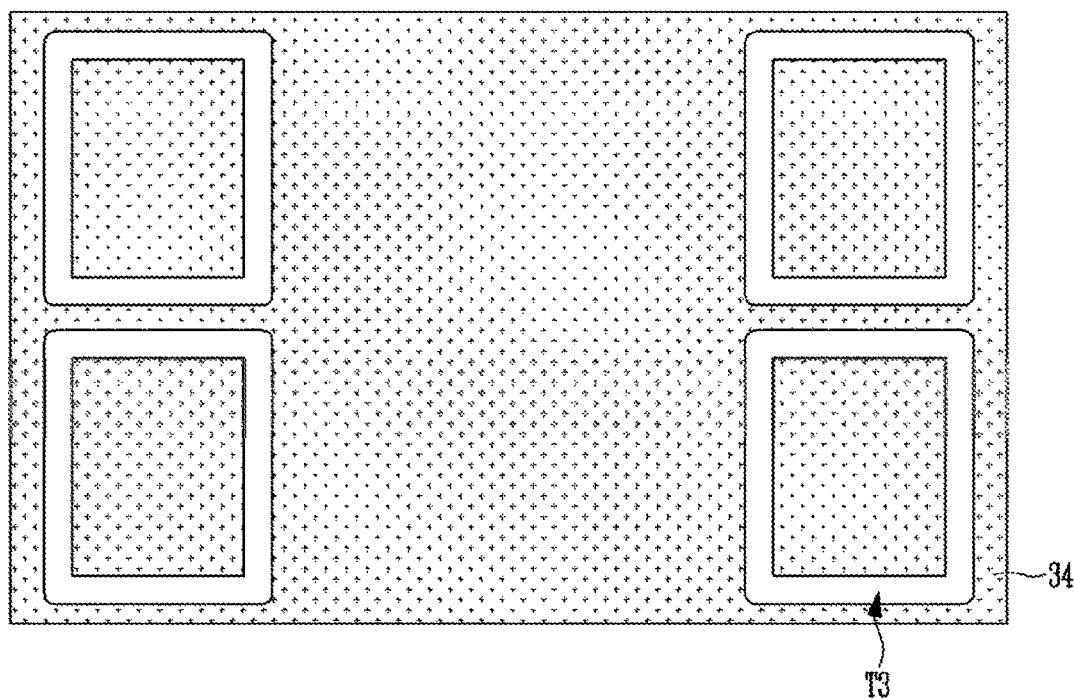
Figure 4B:
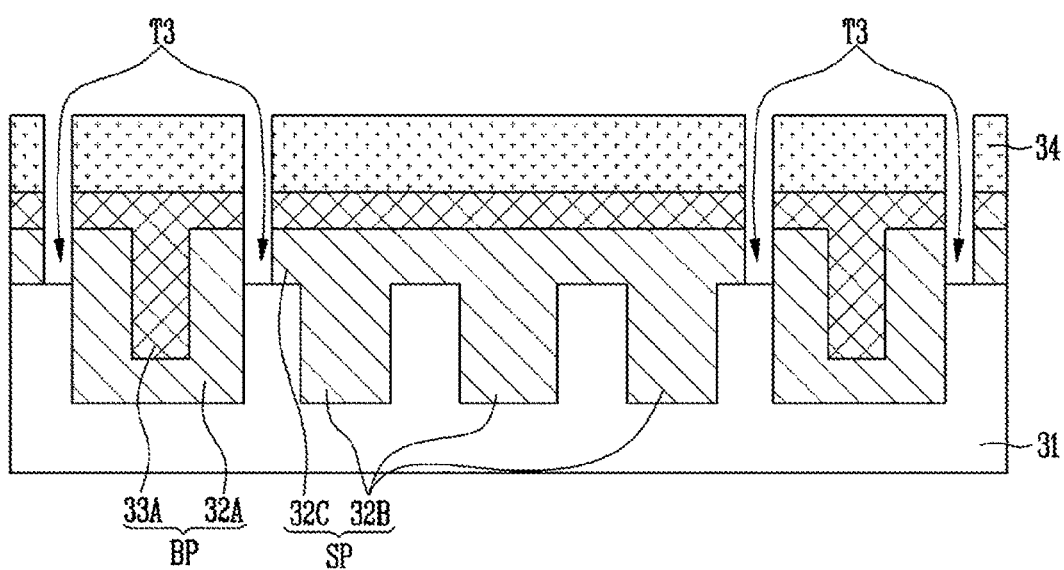

Referring to FIGS. 4A and 4B, the metal layer 32 and the electron hole source layer 33 may be patterned, thereby forming a bulk pattern PB and a source pattern SP. For example, a mask pattern 34 is formed on the electron hole source layer 33, and the electron hole source layer 33 and the metal layer 32 are then etched using the mask pattern 34 as an etch barrier, thereby forming third trenches T3. Here, the mask pattern 34 may include an opening formed in the shape of a single closed curve surrounding the first trench T1.

Accordingly, the bulk pattern PB and the source pattern SP may be isolated from each other. For example, the bulk pattern PB may be formed in a pocket shape, and the source pattern SP may be formed in a plate shape in a cell region. For example, one source pattern SP and a plurality of bulk patterns BP may be located at a lower portion of a memory cell region (e.g., one memory block). In the memory cell region, a memory cell array may be formed. The memory cell array of the semiconductor device may be grouped into a series of memory blocks, which are the smallest erasable entities.

The bulk pattern BP may include a metal pattern 32A and an electron hole source 33A in the metal pattern 32A. The bulk pattern BP may be located in the first trench T1, and may have a height higher than the depth of the first trench T1. Therefore, the bulk pattern BP may protrude upwardly from the upper surface of the insulating layer 31. The source pattern SP may include a body part 32C and a protruding parts 32B protruding from a bottom surface of the body part 32C. Here, the protruding parts 32B may be formed in the second trenches T2, and the body part 32C may be formed on the upper surface of the insulating layer 31.

Figure 5:
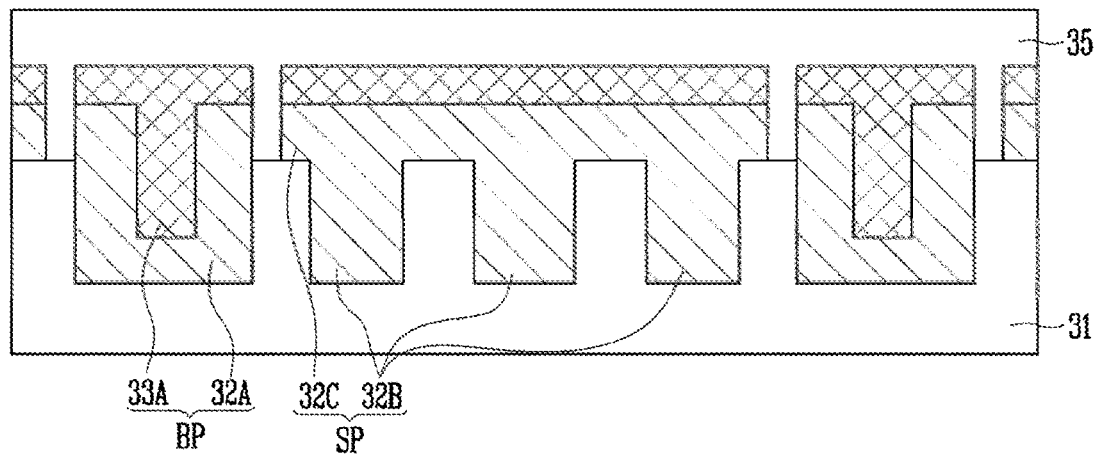
Figure 6:
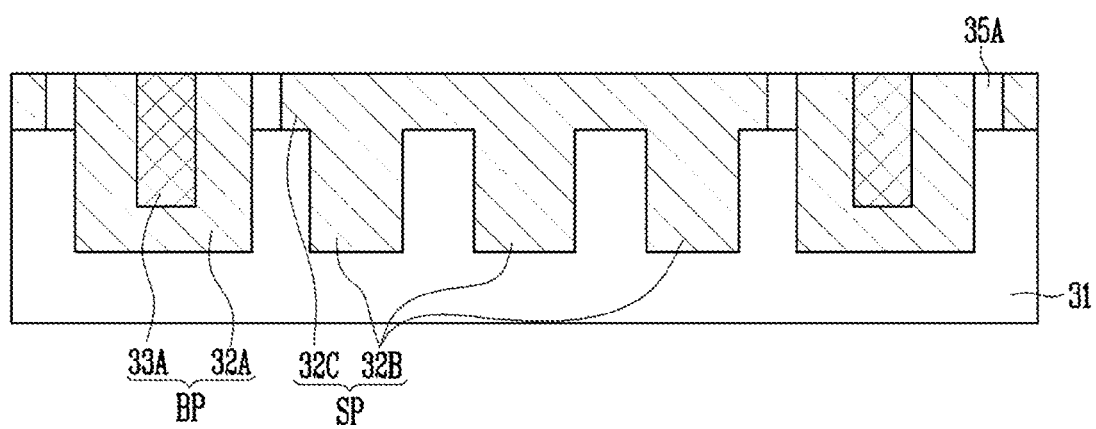

Referring to FIGS. 5 and 6, an insulating layer 35 may be formed on an intermediate resultant structure having the third trenches T3 formed therein, and the insulating layer 35 and the electron hole source layer 33 may be planarized until upper surfaces of the metal pattern 32A and the body part 32C are exposed. Accordingly, insulating patterns 35A are formed in the third trenches T3, and the bulk pattern BP and the source pattern SP are insulated from each other by the insulating patterns 35A. In addition, the electron hole source layer 33 may be removed from an area on the source pattern SP. In this way, the electron hole source 33A remains only in the bulk pattern BR.

Figure 7:
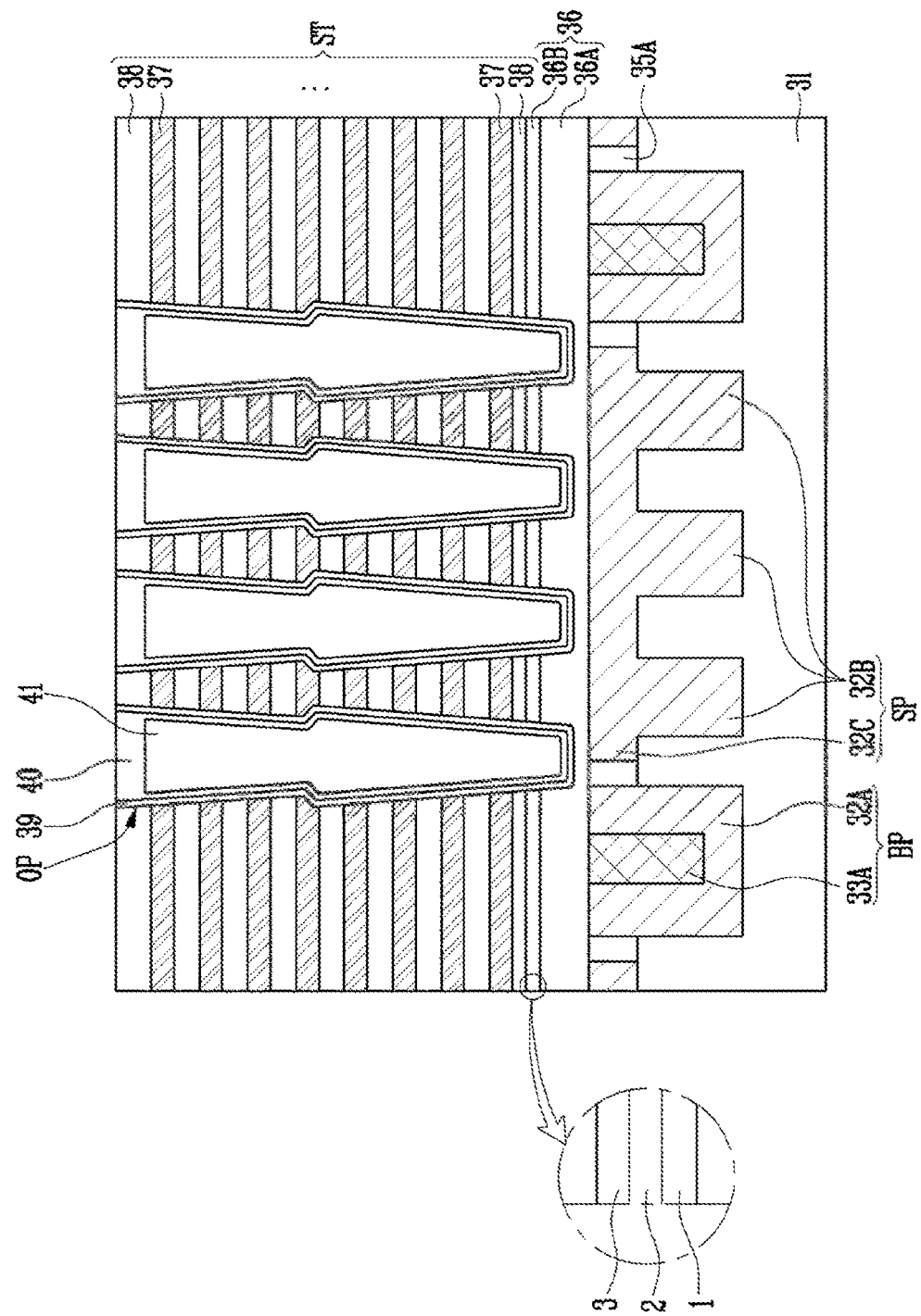

Referring to FIG. 7, a sacrificial layer 36 may be formed on an intermediate resultant structure having the insulating patterns 35A formed therein. The sacrificial layer 36 may be used to form a connection layer, and may be formed in multiple layers. For example, the sacrificial layer 36 may include a first connecting layer 36A and a sacrificial layer 36B on the first connecting layer 36A. The first connecting layer 36A may connect the bulk pattern BP and the source pattern SP to each other, and may be a polysilicon layer including an N-type impurity. Also, the sacrificial layer 36B may include a material having a higher etch selectivity with respect to the first connecting layer 36A, or may include a material having a higher etch selectivity with respect to first and second material layers formed in a subsequent process. For example, the sacrificial layer 36B may have a structure in which a buffer oxide layer 1, a sacrificial polysilicon layer 2, and a dielectric layer 3 are sequentially stacked. The sacrificial layer 36B may include a material having a high dielectric constant, such as an aluminium oxide $Al_2O_3$.

Subsequently, a stack structure ST in which first material layers 37 and second material layers 38 are alternately stacked is formed on the sacrificial layer 36. The first material layers 37 may be used to form conductive layers such as word lines, select lines, and pads, and the second material layers 38 may be used to insulate the stacked conductive layers from each other.

The first material layers 37 may be formed of a material having a higher etch selectivity with respect to the second material layers 38. In an example, the first material layers 37 may include a sacrificial material such as nitride, and the second material layers 38 may include an insulating material such as oxide. In another example, the first material layers 37 may include a conductive material such as polysilicon or tungsten, and the second material layers 38 may include an insulating material such as oxide. In another example, the first material layers 37 may include a conductive material such as doped polysilicon, and the second material layers 38 may include a sacrificial material such as undoped polysilicon.

Subsequently, a channel pattern 40 penetrating the stack structure ST may be formed. For example, an opening OP may penetrate the stack structure ST and expose the sacrificial layer 36 therethrough, and the channel pattern 40 may be formed in the opening OP. The opening OP may have a depth at which it completely penetrates the stack structure ST and partially penetrates the sacrificial layer 36.

Before the channel pattern 40 is formed, a memory pattern 39 may be formed in the opening OP. The memory pattern 39 may include at least one of a charge blocking layer, a data storage layer, and a tunnel insulating layer. The data storage layer may include a floating gate material such as silicon, a charge trap material such as nitride, a phase change material, nano-dots, etc. The channel pattern 40 may be formed in a way that fills a central region of the opening OP. Alternatively, the channel pattern 18 may be formed in a way that leaves the central region of the opening OP empty. In this case, a gap fill layer 41 may fill the empty space (e.g., central region) of the channel pattern 40.

Here, a process of forming the stack structure ST may be divided into subprocesses, and a number of the subprocesses may vary depending on how many layers are formed in the stack structure ST. For example, a first stack structure and a first opening penetrating the first stack structure are formed, and a sacrificial layer is then formed in the first opening. Subsequently, a second stack structure and a second opening penetrating the second stack structure are formed, and the sacrificial layer is then removed through the second opening, thereby re-opening the first opening. Subsequently, a channel pattern is formed in the first and second openings. Although FIG. 7 illustrates the process of the stack structure ST as being divided into two subprocesses, the present disclosure is not limited thereto, and thus the process of the stack structure ST may be divided into three or more subprocesses.

Figure 8:
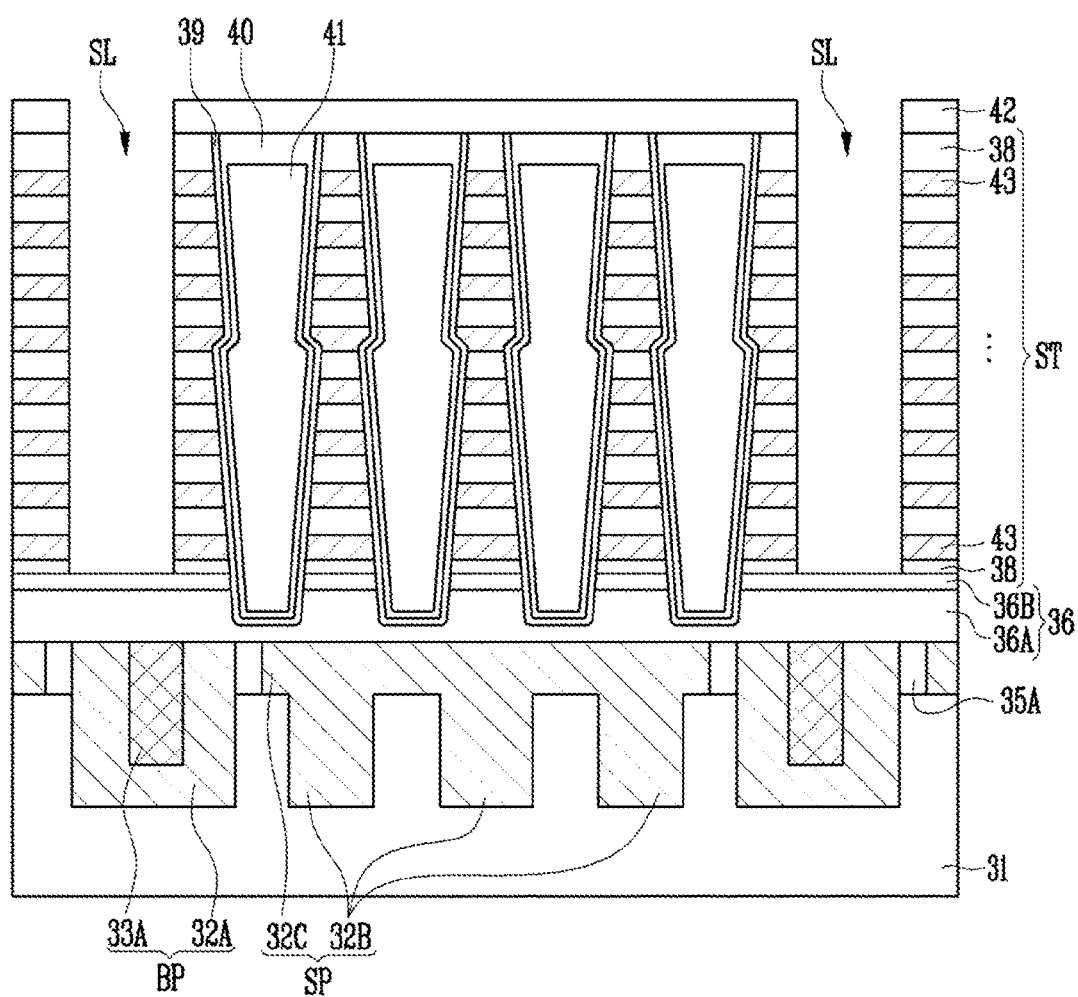

Referring to FIG. 8, an interlayer insulating layer 42 may be formed on the stack structure ST having the channel pattern 40 therein, and then a slit SL penetrating the stack structure ST may be formed. The slit SL may have a depth such that the slit SL completely penetrates the stack structure ST and exposes the sacrificial layer 36 therethrough. In this case, the dielectric layer 3 included in the sacrificial layer 36B may be used as an etch stop layer.

Subsequently, the first material layers 37 or the second material layers 38 may be replaced with third material layers 43 through the slit SL. For example, after openings are formed by selectively removing the first material layers 37 or the second material layers 38, the third material layers 43 may be formed in the openings.

In an example, if the first material layers 37 are sacrificial layers and the second material layers 38 are insulating layers, the first material layers 37 may be replaced with conductive layers. In another example, if the first material layers 37 are conductive layers and the second material layers 38 are insulating layers, the first material layers 37 may be silicidized. In this case, only some of the first material layers 37 may be silicidized. In another example, if the first material layers 37 are conductive layers and the second material layers 38 are sacrificial layers, the second material layers 38 may be replaced with insulating layers.

Figure 9:
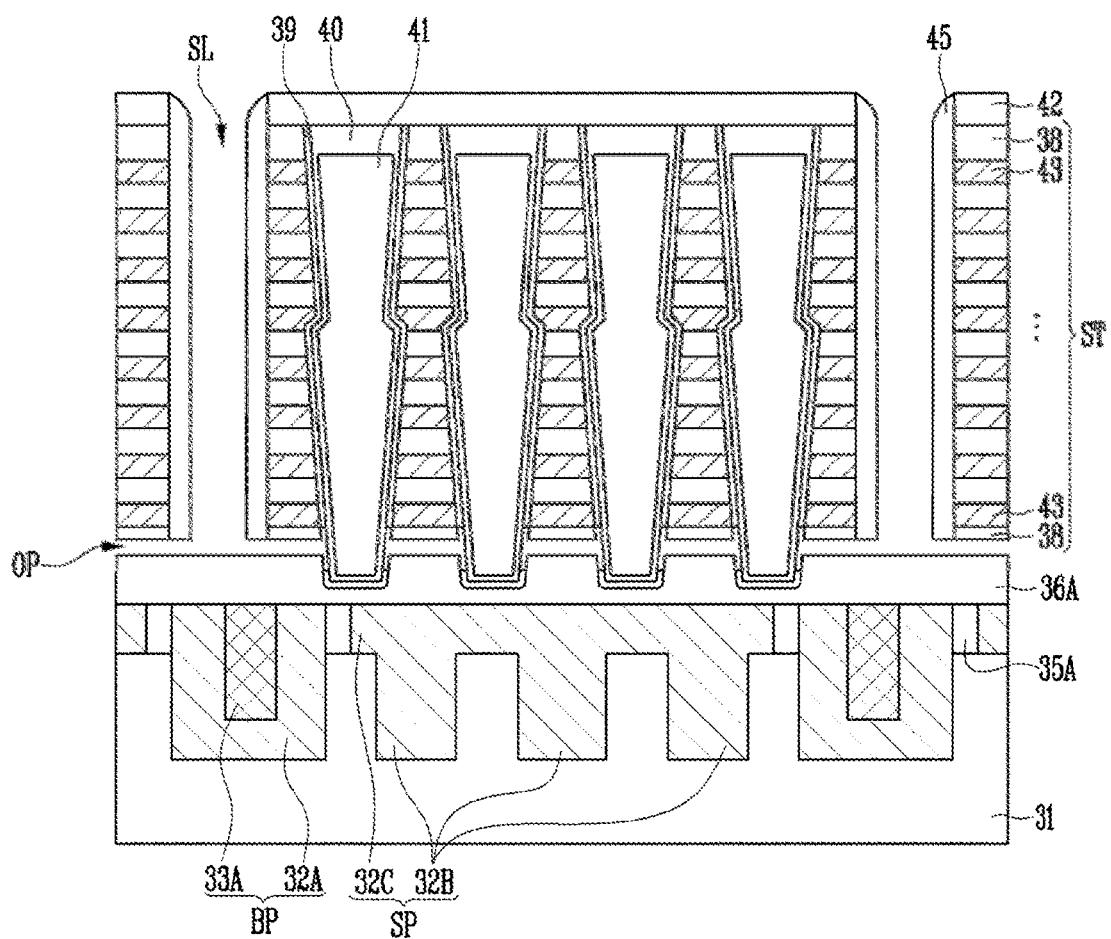

Referring to FIG. 9, a spacer 45 may be formed on an inner wall of the slit SL, and the sacrificial layer 36 may be removed through the slit SL, thereby forming an opening OP. At this time, the stack structure ST may be protected by the spacer 45, and thus the sacrificial layer 36 may be selectively removed. For example, the first connecting layer 36A of the sacrificial layer 36 may remain while the sacrificial layer 36B of the sacrificial layer 36 is being selectively removed. In addition, the memory pattern 39 exposed in the opening OP may be removed, thereby exposing the channel patterns 40 in the opening OP.

Figure 10:
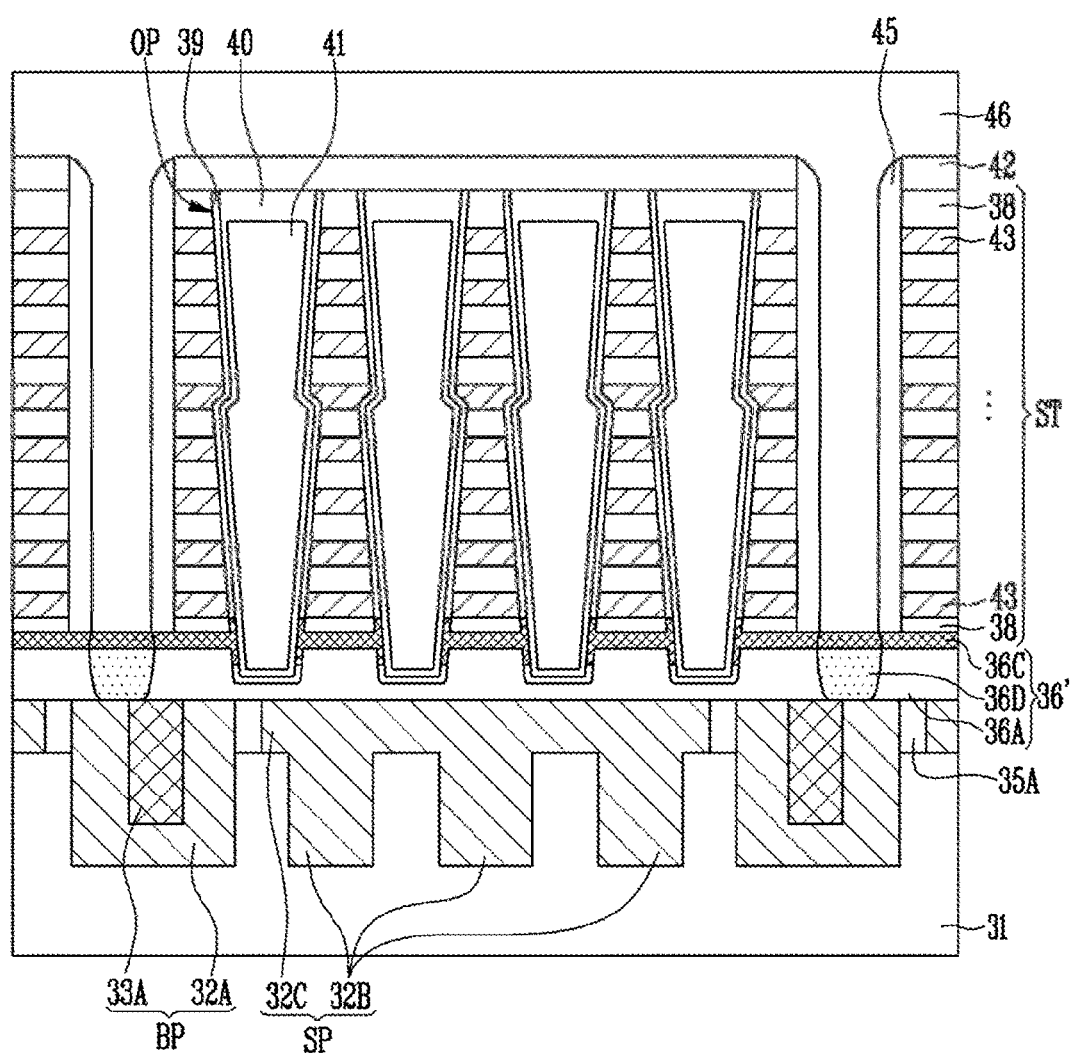

Referring to FIG. 10, a second connecting layer 36C may be formed in the opening OP. The second connecting layer 36C may connect the first connecting layer 36A and the channel pattern 40 to each other. Thus, the channel pattern 40 may be connected to the bulk pattern BP and the source pattern SP through the first and second connecting layers 36A and 36C. In an example, the second connecting layer 36C may be grown from the first connecting layer 36A and the channel pattern 40, which are exposed in the opening OP. In another example, the second connecting layer 36C may be selectively deposited on the first connecting layer 36A and the channel pattern 40, which are exposed in the opening OP.

Subsequently, an impurity region 36D may be formed in the first and second connecting layers 36A and 36C through the slit SL. The impurity region 36D may contact the bulk pattern BP. For example, the impurity region 36D may contact the electron hole source 33A. When the first connecting layer 36A includes an N-type impurity, a P-type impurity may be doped into the first and second connecting layers 36A and 36C, thereby forming the impurity region 36D.

Accordingly, a connecting layer 36' may include the first connecting layer 36A contacting the bulk pattern BP and the source pattern SP, the second connecting layer 36C contacting the first connecting layer 36A and the channel pattern 40, and the impurity region 36D. Also, the connecting layer 36' may include an impurity of the same type as the source pattern SP (e.g., an N-type impurity) in a region contacting the source pattern SP, and may include an impurity of the same type as the bulk pattern BP (e.g., a P-type impurity) in a region contacting the bulk pattern BP.

Subsequently, an insulating layer 46 may be formed on the stack structure ST. The insulating layer 46 may fill the slit SL. The insulating layer 46 in the slit SL may be a slit insulating layer.

For reference, although not illustrated, contact plugs penetrating the slit SL and interconnect lines on the stack structure ST may be formed, thereby forming an interconnect through which an erase bias is supplied to the bulk pattern BP (see FIG. 2B). In addition, a circuit that is connected to the source pattern SP may be formed under the insulating layer 31 (see FIG. 2A).

Figure 11:
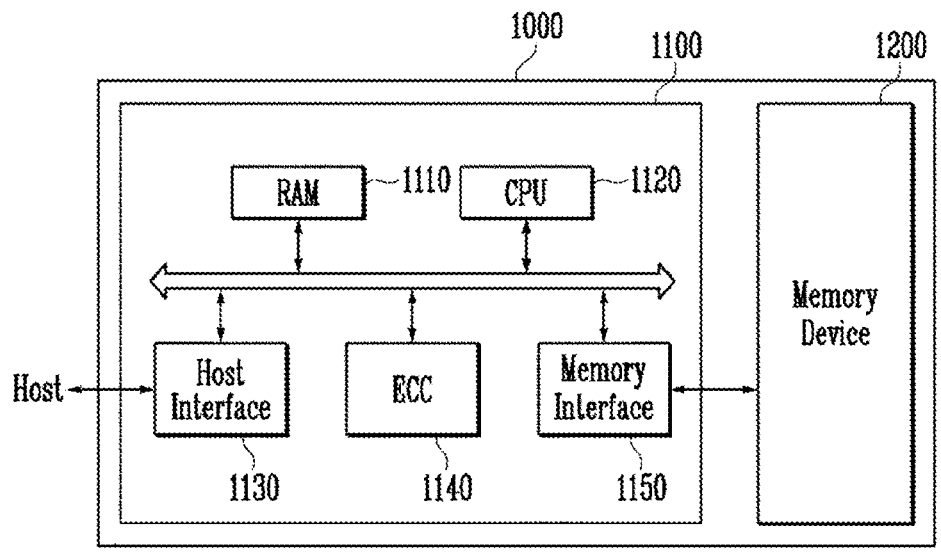
FIGS. 11 and 12 are diagrams illustrating example configurations of memory systems according to embodiments of the present disclosure.

FIG. 11 is a diagram illustrating an example configuration of a memory system according to an embodiment of the present disclosure.

Referring to FIG. 11, the memory system 1000 according to an embodiment of the present disclosure may include a memory device 1200 and a controller 1100.

The memory device 1200 may be used to store data information having various data formats such as texts, graphics, and software codes. The memory device 1200 may be a nonvolatile memory, and may include the memory cell string described with reference to FIGS. 1A to 10. Also, the memory device 1200 may include an insulating layer, a bulk pattern, a stack structure, and a channel pattern. A first trench may be formed in the insulating layer. The bulk pattern may be located in the first trench, the bulk pattern including a metal pattern and an electron hole source. The stack structure may be located on the insulating layer, and may include conductive layers and insulating layers, which are alternately stacked. The channel pattern may penetrate the stack structure, and may be supplied with electron holes from the bulk pattern. The structure and manufacturing method of the memory device 1200 are the same as those described above, and therefore any repetitive detailed description will be omitted.

The controller 1100 may be electrically connected to an external device (e.g., host) and the memory device 1200, and may access the memory device 1200 in response to a request from the host. For example, the controller 1100 may control reading, writing, erasing, and background operations of the memory device 1200.

The controller 1100 may include a random access memory (RAM) 1110, a central processing unit (CPU) 1120, a host interface 1130, an error correction code (ECC) circuit 1140, a memory interface 1150, and the like.

Here, the RAM 1110 may be used as an operation memory of the CPU 1120, a cache memory between the memory device 1200 and the host, and a buffer memory between the memory device 1200 and the host. For reference, the RAM 1110 may be replaced with a static random access memory (SRAM), a read only memory (ROM), etc.

The CPU 1120 may control the general operations of the controller 1100. For example, the CPU 1120 may operate firmware such as a flash translation layer (FTL) stored in the RAM 1110.

The host interface 1130 is configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 may detect and correct an error included in data that is read from the memory device 1200, using an error correction code (ECC).

The memory interface 1150 may interface with the memory device 1200. For example, the memory interface 1150 may include an NAND interface or NOR interface.

The controller 1100 may further include a buffer memory (not illustrated) for temporarily storing data. Here, the buffer memory may be used to temporarily store data transferred to an external device through the host interface 1130 or data transferred from the memory device 1200 through the memory interface 1150. The controller 1100 may further include a ROM that stores code data for interfacing with the host.

As described above, the memory system 1000 according to an embodiment of the present disclosure may include the memory device 1200 formed at high integration density and having improved characteristics, and thus it is possible to miniaturize the memory system 1000.

Figure 12:
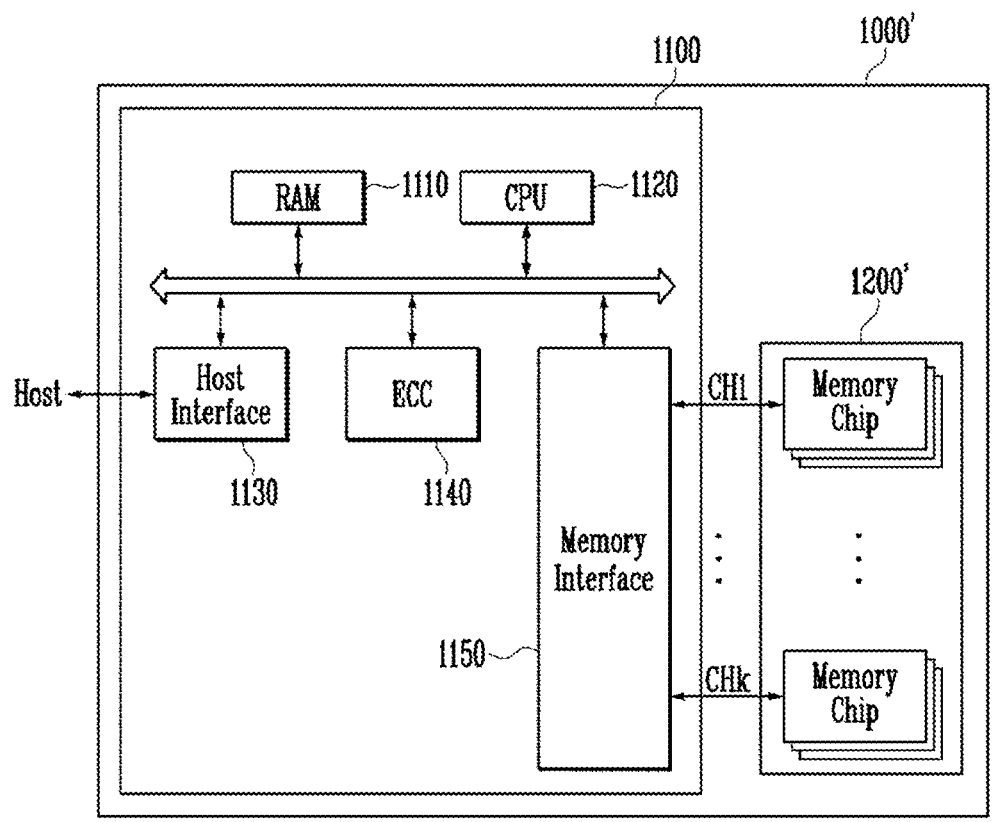

FIG. 12 is a diagram illustrating an example configuration of a memory system according to an embodiment of the present disclosure. Hereinafter, any repetitive detailed description will be omitted or simplified.

Referring to FIG. 12, the memory system 1000' according to an embodiment of the present disclosure may include a memory device 1200' and a controller 1100. The controller 1100 may include a RAM 1110, a CPU 1120, a host interface 1130, an ECC circuit 1140, a memory interface 1150, and the like.

The memory device 1200' may be a nonvolatile memory, and may include the memory cell string described with reference to FIGS. 1A to 10. Also, the memory device 1200' may include an insulating layer, a bulk pattern, a stack structure, and a channel pattern. A first trench may be formed in the insulating layer. The bulk pattern may be located in the first trench, and may include a metal pattern and an electron hole source. The stack structure may be located on the insulating layer, and may include conductive layers and insulating layers, which are alternately stacked. The channel pattern may penetrate the stack structure, and may be supplied with electron holes from the bulk pattern. The structure and manufacturing method of the memory device 1200' are the same as those described above, and therefore any repetitive detailed description will be omitted.

The memory device 1200' may be a multi-chip package including a plurality of memory chips. The plurality of memory chips may be divided into a plurality of groups, which are configured to communicate with the controller 1100 over first to $k^{th}$ channels (CH1 to CHk). In addition, memory chips included in a group may communicate with the controller 1100 over a common channel. Alternatively, the memory system 1000' may be modified such that a single memory chip is connected to a single channel.

As described above, the memory system 1000' according to an embodiment of the present disclosure may include the memory device 1200' formed at high integration density and having improved characteristics, and thus it is possible to miniaturize the memory system 1000'. Particularly, the memory device 1200' may be manufactured in the form of a multi-chip package to be able to increase the data storage capacity of the memory system 1000' and to improve the operation speed of the memory system 1000'.

Figure 13:
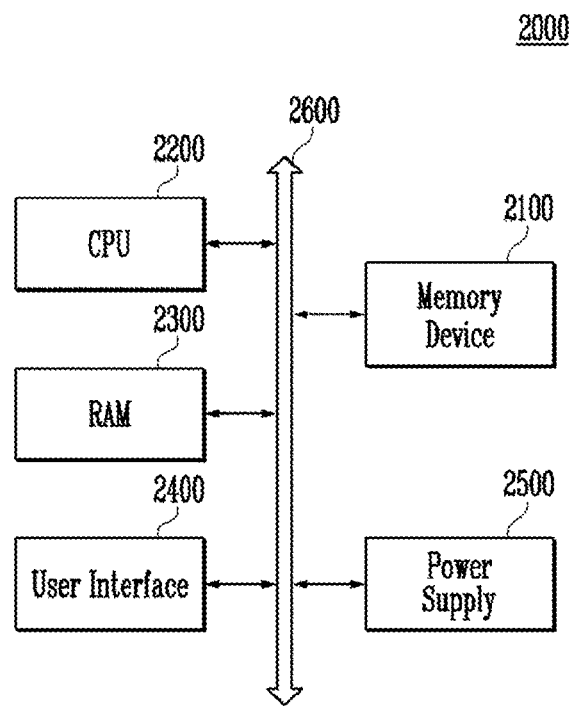
FIGS. 13 and 14 are diagrams illustrating example configurations of computing systems according to embodiments of the present disclosure.

FIG. 13 is a diagram illustrating an example configuration of a computing system according to an embodiment of the present disclosure. Hereinafter, any repetitive detailed description will be omitted.

Referring to FIG. 13, the computing system 2000 according to an embodiment of the present disclosure may include a memory device 2100, a CPU 2200, a RAM 2300, a user interface 2400, a power source 2500, a system bus 2600, and the like.

The memory device 2100 may store data provided through the user interface 2400, data processed by the CPU 2200, and the like. In addition, the memory device 2100 may be electrically connected to the CPU 2200, the RAM 2300, the user interface 2400, the power source 2500, and the like through the system bus 2600. For example, the memory device 2100 may be electrically connected to the system bus 2600 through a controller (not illustrated) or directly. When the memory device 2100 is directly connected to the system bus 2600, a function of the controller may be performed by the CPU 2200, the RAM 2300, etc.

Here, the memory device 2100 may be a nonvolatile memory, and may include the memory cell string described with reference to FIGS. 1A to 10. Also, the memory device 2100 may include an insulating layer, a bulk pattern, a stack structure, and a channel pattern. A first trench may be formed in the insulating layer. The bulk pattern may be located in the first trench, and may include a metal pattern and an electron hole source. The stack structure may be located on the insulating layer, and may include conductive layers and insulating layers, which are alternately stacked. The channel pattern may penetrate the stack structure, and may be supplied with electron holes from the bulk pattern. The structure and manufacturing method of the memory device 2100 are the same as described above, and therefore any repetitive detailed description will be omitted.

The memory device 2100 may be a multi-chip package including a plurality of memory chips as described with reference to FIG. 12.

The computing system 2000 configured as described above may be a computer, a ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 according to an embodiment of the present disclosure includes the memory device 2100 having an improved degree of integration and improved characteristics, and thus it is possible to improve the degree of integration and characteristics of the computing system 2000.

Figure 14:
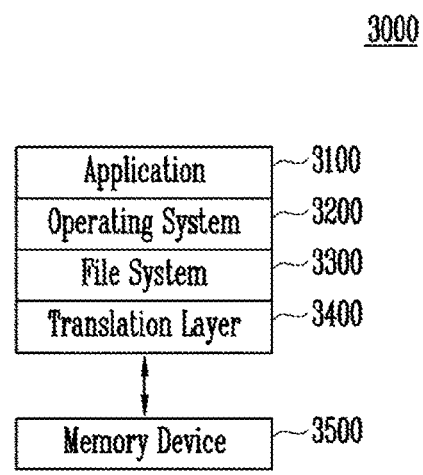

FIG. 14 is a diagram illustrating an example of a computing system according to an embodiment of the present disclosure.

Referring to FIG. 14, the computing system 3000 according to an embodiment of the present disclosure may include a software layer including an operating system 3200, an application 3100, a file system 3300, a translation layer 3400, and the like. In addition, the computing system 3000 may include a hardware layer of a memory device 3500, etc.

The operating system 3200 may manage software resources, hardware resources, etc. of the computing system 3000, and control program execution of a central processing unit. The application 3100 may be one of a variety of application programs running on the computing system 3000, and may be a utility executed by the operating system 3200.

The file system 3300 may mean a logical structure for managing information such as data files in the computing system 3000, and may organize the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

Although the operating system 3200, the application 3100, and the file system 3300 are illustrated as being individual blocks. However, the application 3100 and the file system 3300 may be included in the operating system 3200.

The translation layer 3400 may translate an address into a form suitable for the memory device 3500 in response to a request from the file system 3300. For example, the translation layer 3400 may translate a logical address generated by the file system 3300 into a physical address of the memory device 3500. Here, mapping information between the logical address and the physical address may be stored as an address translation table. For example, the translation layer 3400 may be a flash translation layer (FTL), a universal flash storage link layer (ULL), etc.

The memory device 3500 may be a nonvolatile memory, and may include the memory cell string described with reference to FIGS. 1A to 10. Also, the memory device 3500 may include an insulating layer, a bulk pattern, a stack structure, and a channel pattern. A first trench may be formed in the insulating layer. The bulk pattern may be located in the first trench, and may include a metal pattern and an electron hole source. The stack structure may be located on the insulating layer, and may include conductive layers and insulating layers, which are alternately stacked. The channel pattern may penetrate the stack structure, and may be supplied with electron holes from the bulk pattern. The structure and manufacturing method of the memory device 3500 are the same as described above, and therefore any repetitive detailed description will be omitted.

The computing system 3000 configured as described above may be divided into an operating system layer performed in an upper level region and a controller layer performed in a lower level region. Here, the application 3100, the operating system 3200, and the file system 3300 may be included in the operating system layer, and may be driven by the operation memory of the computing system 3000. In addition, the translation layer 3400 may be included in the operating system layer or the controller layer.

As described above, the computing system 3000 according to an embodiment of the present disclosure may include the memory device 3500 formed at high integration density and having improved characteristics, and thus it is possible to miniaturize the computing system 3000.

According to the present disclosure, holes and a slit, which penetrate a stack structure, are simultaneously formed, and patterns are uniformly distributed. Thus, the holes and the slit, which formed in a structure having a high aspect ratio, may have a uniform profile. Also, upper and lower portions of a channel pattern in the hole may have a uniform width, and thus stacked memory cells may have uniform characteristics. Also, widths of the holes and the slit may be decreased, and thus a memory device may be manufactured at high integration density.

According to an embodiment of the present disclosure, an insulating layer located under a cell stack structure may include a pocket-shaped bulk pattern including a P-type electron hole source and a source pattern. In addition, an N-type connecting layer for providing a current path may be located on the insulating layer. Thus, although a peripheral circuit is located under the cell stack structure, holes can be supplied into a channel pattern from the bulk pattern in an erase operation. Also, it is possible to allow the source pattern to be grounded or to apply a source voltage in a read or program operation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
    an insulating layer and a first trench formed in the insulating layer;
    a bulk pattern located in the first trench, the bulk pattern including a metal pattern and an electron hole source;
    a stack structure located on the insulating layer, the stack structure including conductive layers and insulating layers, which are alternately stacked; and
    a channel pattern penetrating the stack structure, the channel pattern being supplied with electron holes from the bulk pattern.

2. The semiconductor device of claim 1, wherein the electron hole source is a polysilicon pattern formed in the metal pattern, the polysilicon pattern including a P-type impurity.

3. The semiconductor device of claim 1, further comprising a connecting layer interposed between the stack structure and the insulating layer, the connecting layer connecting the bulk pattern and the channel pattern to each other.

4. The semiconductor device of claim 3, wherein the connecting layer includes:
    a first connecting layer interposed between the insulating layer and the stack structure, the first connecting layer contacting the bulk pattern; and
    a second connecting layer interposed between the first connecting layer and the stack structure, the second connecting layer contacting the channel pattern.

5. The semiconductor device of claim 4, wherein the first connecting layer is a polysilicon layer including an N-type impurity, and the electron hole source is a polysilicon pattern including a P-type impurity.

6. The semiconductor device of claim 3, wherein the connecting layer includes an impurity region contacting the electron hole source, the impurity region including a P-type impurity.

7. The semiconductor device of claim 1, further comprising:
    a second trench formed in the insulating layer, the second trench having a narrower width than the first trench; and
    a source pattern formed in the second trench.

8. The semiconductor device of claim 7, wherein the source pattern includes the same material as the metal pattern and is located at substantially the same level as the bulk pattern.

9. The semiconductor device of claim 7, wherein the bulk pattern and the source pattern are insulated from each other by the insulating layer.

10. The semiconductor device of claim 7, further comprising a circuit located under the insulating layer, the circuit being electrically connected to the source pattern.

11. The semiconductor device of claim 10, wherein, in a read operation, the source pattern is grounded by the circuit.

12. The semiconductor device of claim 1, wherein, in an erase operation, electron holes are supplied into the channel pattern from the electron hole source.

13. A semiconductor device comprising:
    a bulk pattern located in an insulating layer, the bulk pattern including an electron hole source;
    a source pattern located in the insulating layer;
    a stack structure located on the insulating layer, the stack structure including conductive layers and insulating layers, which are alternately stacked;
    a channel pattern penetrating the stack structure; and
    a connecting layer interposed between the insulating layer and the stack structure, the connecting layer connecting the bulk pattern, the source pattern, and the channel pattern to each other.

14. The semiconductor device of claim 13, wherein the bulk pattern includes a metal pattern and an electron hole source in the metal pattern, and the electron hole source is a polysilicon pattern including a P-type impurity.

15. The semiconductor device of claim 14, wherein the metal pattern and the source pattern include the same material, and the source pattern and the bulk pattern are located at substantially the same level as each other.

16. The semiconductor device of claim 13, wherein the bulk pattern has a wider width than the source pattern.

17. The semiconductor device of claim 13, wherein the connecting layer includes:
    a first connecting layer contacting the bulk pattern and the source pattern; and
    a second connecting layer interposed between the first connecting layer and the stack structure, the second connecting layer contacting the channel pattern.

18. The semiconductor device of claim 13, further comprising a circuit located under the insulating layer, the circuit being electrically connected to the source pattern.

19. The semiconductor device of claim 18, wherein, in a read operation, the source pattern is grounded by the circuit.

20. The semiconductor device of claim 13, wherein, in an erase operation, electron holes are supplied into the channel pattern from the electron hole source.

* * * * *